United States Patent [19]
Itoh et al.

[11] Patent Number: 5,291,536
[45] Date of Patent: Mar. 1, 1994

[54] X-RAY MASK, METHOD FOR FABRICATING THE SAME, AND PATTERN FORMATION METHOD

[75] Inventors: Masamitsu Itoh, Yokohama; Shinji Sugihara, Tokyo; Ken-ichi Murooka, Yokohama, all of Japan

[73] Assignee: Kabushiki Kaisha Toshiba, Kawasaki, Japan

[21] Appl. No.: 900,494

[22] Filed: Jun. 18, 1992

[30] Foreign Application Priority Data

Jun. 26, 1991 [JP] Japan ................................. 3-154921
Mar. 27, 1992 [JP] Japan ................................. 4-071379

[51] Int. Cl.⁵ .............................................. G03C 5/00
[52] U.S. Cl. .................................. 378/35; 378/34; 430/5
[58] Field of Search ................... 378/34, 35; 430/5

[56] References Cited
FOREIGN PATENT DOCUMENTS 58-14837  7/1981  Japan ....................... 430/5
63-27019  2/1988  Japan .
3-257814 11/1991  Japan .

OTHER PUBLICATIONS

H. Lüthje et al., "X-ray Lithography: Novel Fabrication Process for SiC/W Steppermasks", Nov. 1989, pp. 2343-2347, Japanese Journal of Applied Physics.
Proceeding of the Fifty-first Meeting of the Japan Society of Applied Physics p. 455, 26a-Y-7 (In the Japanese Language).

*Primary Examiner*—David P. Porta
*Assistant Examiner*—Don Wong
*Attorney, Agent, or Firm*—Finnegan, Henderson, Farabow, Garrett & Dunner

[57]  ABSTRACT

A method for forming an X-ray exposure mask having an X-ray permeable film with a high visible-light transmissivity. The method includes the steps of forming an aluminum oxide anti-reflective film on an x-ray permeable film, placing an x-ray absorber on the anti-reflective film and etching with the x-ray absorber to form x-ray pattern.

12 Claims, 10 Drawing Sheets

|  | ETCHING RATE (nm/min) | SELECTION RATIO TO W FILM |
|---|---|---|
| W | 80 |  |
| SiO2 | 20 | 4 |
| Al2O3 | 4 | 20 |

| SAMPLE | SiC FILM | WITH SiO2 FILM |
|--------|----------|----------------|
| ① | 49nm | 1nm |
| ② | 50nm | 1nm |
| ③ | 53nm | 1nm |

SURFACE ROUGHNESS (P-V)

*(PRIOR ART)*

X-RAY MASK, METHOD FOR FABRICATING THE SAME, AND PATTERN FORMATION METHOD

BACKGROUND OF THE INVENTION

1. Field of the Invention

The present invention relates to improvements in an X-ray mask and more particularly, to an X-ray mask having an X-ray permeable film made of SiC having a high visible-light transmissivity and also to a method for fabricating the X-ray mask.

2. Description of the Related Art

As higher integration in an integrated circuit is demanded, the importance of micro-processing techniques for circuit patterns, in particular, a lithography technique for forming a pattern on a sensitizer has been recently increased. These days, the lithography technique using visible light as a light exposure medium is used in mass production lines, but its resolution determined by the wavelength of the used visible light is approaching to its limit. Instead, an X-ray lithography technique enabling the remarkable improvement of the resolution in principle has been rapidly developed. In the X-ray lithography, an X-ray exposure mask having a predetermined pattern formed thereon is held parallel to a sample with a spacing therebetween of on the order of 10 $\mu$m so that radiation of X-rays from behind the mask causes the mask pattern to be transferred onto the sensitizer on the sample with a unity magnification.

With such a unity magnification transfer system, since the dimensional and positional accuracies of the X-ray mask pattern reflect directly on the device accuracy, the X-ray mask pattern is required to have dimensional and positional accuracies corresponding nearly to 1/10 of the minimum linewidth of the device. For this reason, the feasibility of realizing such an X-ray lithography depends on the development of such an X-ray mask having a high accurate X-ray absorber pattern.

An X-ray mask generally comprises a ring-shaped mask substrate made of silicon or the like, such an X-ray permeable film formed on the mask substrate as a SiC thin film having a very small X-ray absorption factor, and a mask pattern formed on the X-ray permeable film and made of a material having a large X-ray absorption factor.

Such an X-ray mask is usually fabricated by such a method as shown in FIGS. 11(a) to 11(f).

Figure 11A:
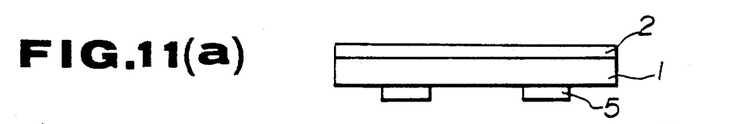
FIGS. 11(a) to 11(f) show steps in a prior art method for fabricating an X-ray mask.

More specifically, as shown in FIG. 11(a), first, a 1 $\mu$m-thick SiC film (X-ray permeable film) 2 is deposited on a silicon substrate 1 as a mask substrate by a low pressure chemical vapor deposition (LPCVD) method. The X-ray permeable film is required to be such a self supporting film having a tensile stress which can transmit X-rays therethrough and can be excellent in the permeability to alignment light (visible light). Reported so far as the material of such X-ray permeable film as to satisfy such requirements are BN, Si, SiN and diamond, in addition to SiC.

Thereafter formed on the back side of the silicon substrate 1 of the aforementioned resultant assembly is a Cr film 5 having an opening.

Figure 11B:
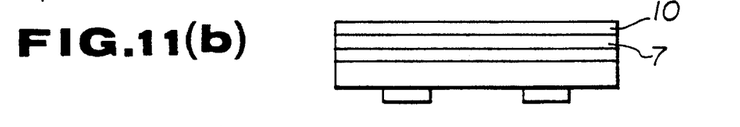

Next, as shown in FIG. 11(b), a 0.5 $\mu$m-thick W film 7 is deposited on the SiC film 2. In this case, the X-ray absorbing material is required to have a large X-ray absorption factor at an exposure wavelength and also to be easy in micro-processing. In addition, since the X-ray absorber is present on the X-ray permeable film as thin as 1 $\mu$m, it is indispensable that the internal stress of the X-ray absorber is as low as about $1\times 10^7 N/m^2$. This is because of the fact that, when the stress of the X-ray absorber is large, this causes the X-ray permeable film to be deformed, which results in that a positional distortion takes place in the X-ray absorber pattern. To avoid this, a sputtering method enabling the stress control is employed to control the internal stress and achieve the desirable deposition.

Figure 11C:
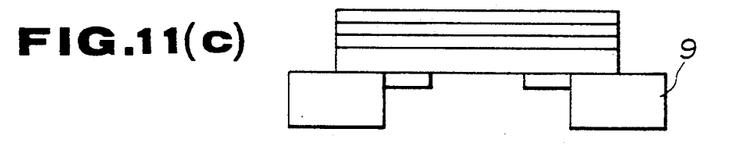

As shown in FIG. 11(c), a supporting frame 9 made of silicon is then joined by a direct bonding method to the silicon substrate 1.

Figure 11D:
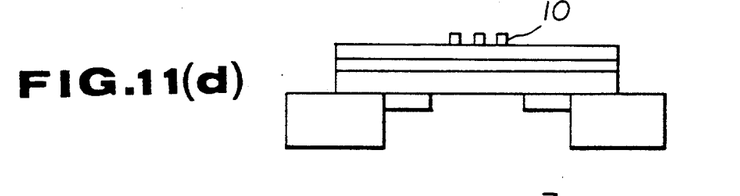

As shown in FIG. 11(d), pattern writing is carried out with use of an electron beam writing system to form a resist pattern 10.

Figure 11E:
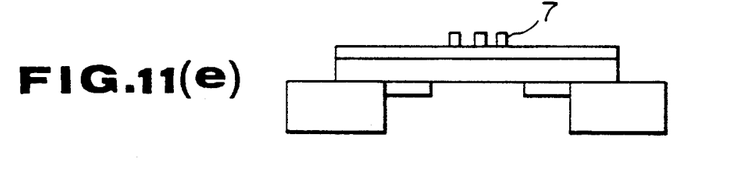

Then, as shown in FIG. 11(e), the W film 7 is subjected to a patterning process by anisotropic etching with use of the resist pattern 10 as a mask.

Figure 11F:
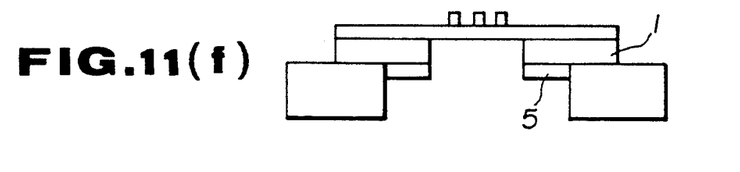

Finally, as shown in FIG. 11(f), liquid phase etching with use of a solution of potassium hydroxide (KOH) is carried out over the silicon substrate 1 with the Cr film 5 used as a mask to make an opening having a diameter of 30 mm therein.

Meanwhile, it is necessary for the purpose of raising its X-ray transmissivity that the X-ray permeable film should be formed as very thin as about 1 $\mu$m. To this end, in order to minimize the pattern positional distortion caused by the stress of the X-ray absorber pattern, the X-ray permeable film is made of an SiC material having a large Young's modulus and a large Poisson's ratio.

In such a circumstance, a very vital issue to be solved for the practical use of the X-ray mask having the X-ray permeable film made of the SiC material is the level of the visible-light transmissivity of the X-ray permeable film. In other words, since alignment between the X-ray mask and a wafer is achieved with use of a He-Ne laser, it is generally required that the X-ray permeable film has a transmissivity of more than 70% at a wavelength of 633 nm, though the transmissivity varies from X-ray stepper to X-ray stepper. However, the SiC and diamond films have actually transmissivities of about 50–60%. This is considered to result from the fact that the SiC or diamond film has a large refractive index of about 2.3–2.6 and also has a large reflection factor at the interface between air (or He atmosphere) and the X-ray permeable film. For the purpose of overcoming this, there has been suggested such a method that an anti-reflective film is coated on an X-ray permeable film to improve a visible-light tranmissivity (refer to Proceeding of The Fifty-first Meeting of The Japan Society of Applied Physics, p.455).

The requirements of the anti-reflective film are that the refractive index n of the film should be close to the square root of the refractive index of the X-ray permeable film and that the thickness of the film should be an odd-number multiple of $\lambda/(4n)$ (where $\lambda$ denotes wavelength). A film having a refractive index of about 1.5–1.6 is suitable as an anti-reflective film and thus an SiO$_2$ film having a refractive index of 1.45 has been used. Further, for the purpose of minimizing the absorption by the anti-reflective film itself, the thickness of the film is set to be 109 nm ($\lambda/4$).

However, this proposal has been defective in that, since an X-ray absorber pattern of such heavy metal as W formed on the anti-reflective film is formed by a reactive ion etching process, the anti-reflective film is also subjected to the etching in this etching process. In more detail, during the etching of the X-ray absorber pattern, a micro-loading effect causes a slow etching rate for a fine pattern while causes a fast etching rate for a rough pattern, which means that an etching end point varies with the pattern dimensions. For this reason, when the anti-reflective film as the underlying layer of the X-ray absorber pattern is small in its etching resistance, the anti-reflective film as the underlying layer of the rough X-ray absorber pattern is also subjected to the etching at the end of the etching operation of the fine pattern, which results in that the film thickness is varied and thus a sufficient anti-reflective effect cannot be realized. In actual applications, a gas containing fluorine such as $CF_4$ or $SF_6$ is used as an etching gas for the etching of the W film and at the same time, it is used as the etching gas for the $SiO_2$ film, thus resulting undesirably in a small selection ratio between the both.

For the purpose of avoiding this, there has been proposed such a method that an X-ray absorber pattern is formed and thereafter an anti-reflective film is coated on the X-ray absorber pattern. This method however has a problem that, since the anti-reflective film is also deposited even on the side walls of the X-ray absorber pattern, contrast at the edge portions of the pattern is reduced and thus it becomes impossible to obtain an abrupt resist pattern. In addition, since the anti-reflective film is formed after the formation of the X-ray absorber pattern, its stress control also becomes very difficult.

The above method has another problem that the X-ray permeable film has a surface roughness as large as 50 nm (p-v) while the anti-reflective film formed on the X-ray permeable film is as thin as about 109 nm as already explained above, so that the surface roughness cannot be improved remarkably and this inevitably involves the reduction of its transmissivity caused by surface scattering. For the purpose of making the X-ray permeable film smooth, it is considered to form a thick anti-reflective film, but this imposes a very difficult stress control requirement and also involves the influence of light absorption by the anti-reflective film.

Furthermore, even the formation of the X-ray absorber pattern involves a large etching problem.

More specifically, when it is desired to subject the W film with an X-ray absorber pattern of a 1 G DRAM level and having a minimum linewidth of 0.15 μm to an etching process with use of the resist as an etching mask, for example, its aspect ratio becomes close nearly to 10. In such an etching as to have a large aspect ratio, a micro-loading effect becomes a serious problem. That is, since an etching rate become slow for a fine pattern and becomes fast for a rough pattern, the etching end point varies depending on the pattern dimensions. Further, the sectional shape of the pattern also varies with different pattern dimensions (dimension conversion difference becomes large). For the purpose of reducing the influences of the micro-loading effect, it is necessary to make small the thickness of the etching mask. Because of the small selection ratio between the resist and W film, an $SiO_2$ film has been employed as a mask material other than the resist in some cases. However, its selection ratio is not sufficient still and the $SiO_2$ film must be made nearly as thick as the W film. In addition, when the thick etching mask remains on the X-ray absorber, its stress becomes a serious problem.

In this way, in the etching of the X-ray absorber pattern, it is required to make the mask material as thin as possible.

This requirement becomes a big problem not only in the formation of the X-ray absorber pattern but also in the etching of a microfine pattern.

As explained above, in order to improve the visible light transmissivity of the conventional X-ray permeable film, the X-ray permeable film is coated with the anti-reflective film. However, since the anti-reflective film is small in the etching resistance to the etching conditions for the X-ray absorber, it has been impossible to achieve a sufficient anti-reflective effect.

Further, since the surface roughness of the X-ray permeable film is large, even when the anti-reflective film is coated on the X-ray permeable film, this disadvantageously cannot prevent the reduction of the transmissivity caused by the surface scattering and also cannot attain a sufficient anti-reflective effect.

Furthermore, it is highly difficult to form a thin mask material for the etching of a microfine heavy metal pattern and the etching of the microfine pattern requires the realization of a mask pattern having a large etching selection ratio.

SUMMARY OF THE INVENTION

In view of the above circumstances, it is therefore an object of the present invention to provide an X-ray exposure mask which comprises an X-ray permeable film having a high visible light transmissivity.

Another object of the present invention is to provide an X-ray exposure mask in which an anti-reflective film having a high etching resistance to etching conditions for an X-ray absorber pattern is formed so that the entire surface of the mask can have an anti-reflective effect regardless of dimensions of the X-ray absorber pattern, and also an X-ray permeable film having a high visible-light transmissivity is formed uniformly all over an exposure region.

A further object of the present invention is to provide an X-ray exposure mask in which an anti-reflective film having a smooth surface is formed so that a sufficient anti-reflective effect can be obtained, and also an X-ray permeable film having a high visible-light transmissivity is formed.

Yet another object of the present invention is to provide a pattern formation method which can form a microfine pattern.

In a first invention, an aluminum oxide film having a high etching resistance to a gas containing fluorine is used as an anti-reflective film.

In a second invention, an anti-reflective film is formed on an X-ray permeable thin film, the anti-reflective film is coated thereon with an aluminum oxide film, an X-ray absorber thin film is formed, and then etching is carried out with the X-ray absorber thin film used as an etching stopper for pattern formation of the X-ray absorber thin film.

In a third invention, an anti-reflective film is made thick to such an extent that the surface roughness of an X-ray permeable film can be sufficiently reduced, and then subjected to an etching-back process until it has a desired thickness, thus obtaining a anti-reflective film having a smooth surface.

In a fourth invention, an anti-reflective film is formed by a spin coating method.

Desirably, the anti-reflective film formed by the spin coating method is coated thereon with such aluminum compound as aluminum oxide.

In a fifth invention, an aluminum oxide layer is deposited by a sputtering process on an X-ray absorber thin film, an aluminum oxide layer pattern having a desired shape is formed thereon, and then the X-ray absorber thin film is subjected to an etching process with the aluminum oxide layer pattern used as a mask.

In a sixth invention, an aluminum oxide layer pattern is formed on an etching layer, and then the etching layer is subjected to an etching process with the aluminum oxide layer pattern used as an etching mask.

Desirably, the aluminum oxide layer pattern is formed by a sputtering process.

In accordance with the first invention, since the aluminum oxide film having a high etching resistance to a gas containing fluorine used for etching of the X-ray absorber pattern such as the W film is used as the anti-reflective film, even when it is desired to etch the X-ray absorber pattern, the anti-reflective film can be favorably maintained while avoiding the influences caused by a microloading effect. This is because, when a gas containing fluorine is used, aluminum oxide undergoes substantially no chemical reactive etching action and undergoes actively the etching action by physical sputtering. Thus, a selection ratio can be set at about 20 for the etching of the W and $SiO_2$ films.

Further, since aluminum oxide has a refractive index of about 1.6 at a wavelength of 633 nm, aluminum oxide is highly suitable as the material of the anti-reflective film in the X-ray mask using the X-ray permeable film made of SiC or diamond.

In accordance with the second invention, since the anti-reflective film is coated with the aluminum oxide film having a high etching resistance to a gas containing fluorine for the use of etching of the X-ray absorber pattern such as the W film and the X-ray absorber thin film is subjected to the etching process, the underlying surface can be favorably maintained while avoiding the influences of the microloading effect.

In accordance with the third invention, since the anti-reflective film is made thick to such an extent that the surface roughness of an X-ray permeable film can be sufficiently reduced and then the anti-reflective film is subjected to the etching-back process until it has a desired thickness, an anti-reflective film having a desired thickness and having a smooth surface can be formed and thus its resultant mask can exhibit a sufficient anti-reflective function.

In accordance with the fourth invention, since a silicon oxide film or the like as the anti-reflective film is formed by the spin coating method, an anti-reflective film having a desired thickness and a flat surface can be formed and thus its resultant mask can exhibit a sufficient anti-reflective function.

Further, when the anti-reflective film formed by the spin coating method is coated thereon with such aluminum compound as aluminum oxide, the coated material can act as an etching stopper during the formation of the X-ray absorber pattern and thus its resultant mask can exhibit a sufficient anti-reflective function.

In accordance with the fifth invention, since the X-ray absorber thin film is subjected to the etching process with the aluminum oxide layer pattern used as a mask, a thin and sufficient etching selection ratio can be obtained and an X-ray mask having an accurate pattern with less stress.

In accordance with the sixth invention, since the aluminum oxide layer pattern is formed on the etching layer and then the etching layer is subjected to the etching process with the aluminum oxide layer pattern used as an etching mask, a very high etching selection ratio can be obtained and thus a thin etching mask can be realized.

The etching layer is made of a material containing preferably Ta or W.

Figure 8:
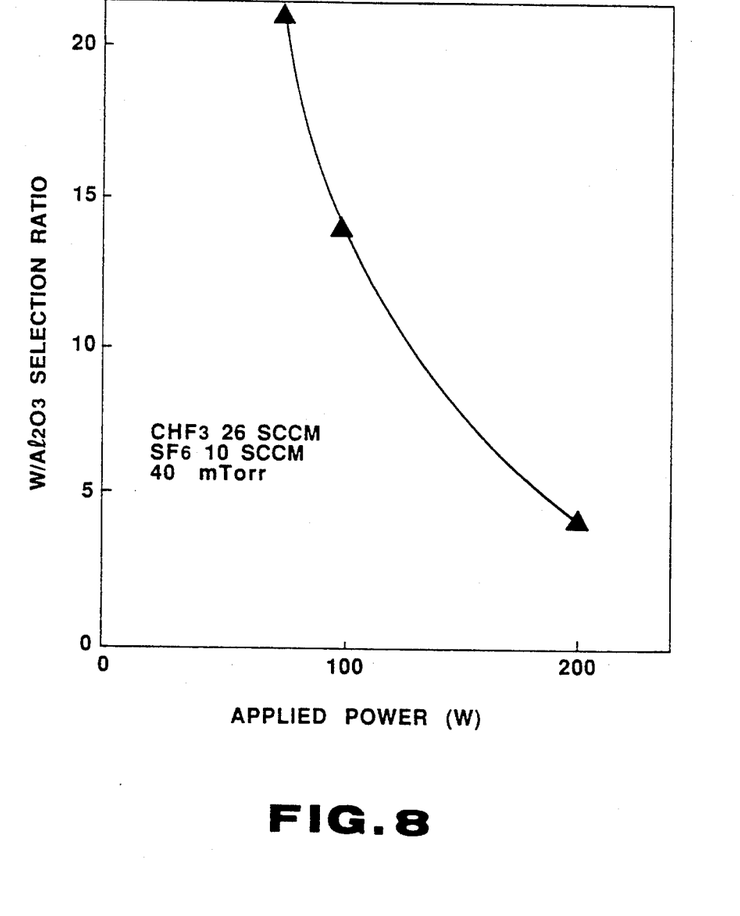
FIG. 8 shows a relationship between the etching selection ratio and applied power with respect to W/aluminum oxide.

Aluminum oxide has a high resistance to the plasma etching using a gas containing fluorine and a selection ratio to the etching layer becomes very large. FIG. 8 shows a selection ratio between the aluminum oxide film and W film when a mixture gas of $SF_6+CHF_3$ is used as an etching gas. In this case, a parallel flat plate type etching system was used, an applied power was changed in a range of 75-200 W, and a pressure was set at 40 mTorr. As a result, even for such heavy metal as W having a slow etching rate, a selection ratio of above 20 can be secured and the aluminum oxide film as the mask film can be made very thin. For example, when it is desired to etch a 0.5 $\mu$m-thick W film, it is just required for the aluminum oxide film to have a thickness of 0.03 $\mu$m only from the selection ratio viewpoint. In this way, aluminum oxide, which can secure a very large etching selection ratio even in the etching of heavy metal, is very effective for the etching of a microfine pattern, in particular, as the etching mask of the X-ray absorber.

It is desirable that the formation of the aluminum oxide layer be carried out by the sputtering process. This becomes effective, in particular, when the film is thin. The reason is that, when the aluminum pattern is formed and then oxidized, the pattern is expanded due to the oxidization and thus deteriorated remarkably in its pattern accuracy. Further, in the case where the pattern is formed and then oxidized, its stress is increased. To avoid this, it is desirable to use aluminum oxide for its patterning in the fabrication of an X-ray mask.

In addition, for the pattern etching of the aluminum oxide, a dry etching using a gas containing $BCl_3$ is desirably employed.

DESCRIPTION OF THE PREFERRED EMBODIMENTS

Embodiments of the present invention will be detailed with reference to the accompanying drawings.

Embodiment 1

FIGS. 1(a) to 1(f) show cross-sectional views of steps in a method for fabricating an X-ray mask in accordance with an embodiment of the present invention.

First of all, a low pressure chemical vapor deposition (LPCVD) system of an RF induction heater type is used, a silicon substrate (mask substrate) 11 polished at its both surfaces and having a diameter of 3 inches, a thickness of 550 μm and a planar orientation (100) is placed on a susceptor coated on its graphite surface with SiC and then subjected to a surface etching process with use of an HCl gas. In this case, the temperature of the substrate was set to be 1100° C. Through the surface etching, such contaminants such as a spontaneous oxide film and a heavy metal group present on the surface of the silicon substrate 11 were removed. At this stage, the cleaning process of the surface of the silicon substrate is completed.

Figure 1A:
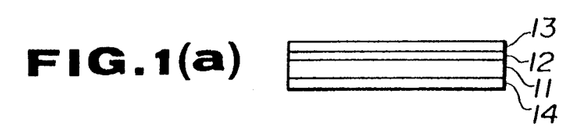
FIGS. 1(a) to 1(j) show steps in a method for fabricating an X-ray exposure mask in accordance with a first embodiment of the present invention.

Then, as shown in FIG. 1(a), a 1 μm-thick SiC film 12 is deposited on the silicon substrate. In this connection, an SiH as a material gas containing Si, a $C_2H_2$ as a material gas containing C, a hydrogen chloride (HCl) gas as a doping or addition gas, and an $H_2$ as a carrier gas were used. The substrate temperature was set to be 1100° C. and the reaction pressure was set to be 1 kPa. The temperature was increased and decreased in an $H_2$ atmosphere. The SiC film was formed under conditions of a flow rate of $SiH_4$ gas of 50 sccm, a flow rate of $C_2H_2$ gas of 25 sccm and a material gas composition ratio (C/Si) of 1.0. The flow rate of the carrier gas was set at 3 slm. Thereafter, an aluminum oxide ($Al_2O_3$) 13 as an anti-reflective film is deposited on the resultant laminate to be 98 nm thick by a sputtering process. The sputtering was carried out under such conditions that aluminum oxide was used as a target material, an Ar flow rate was 20 sccm, a pressure was 3 mTorr and an applied power was 1 kW. A vacuum evaporator using electron beam is then used to deposit a chromium (Cr) film 14 of 0.1 μm thickness on the rear side of the silicon substrate 11.

Figure 1B:
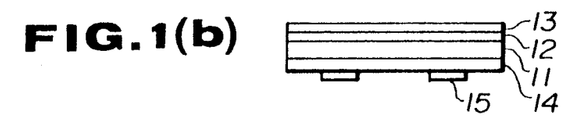

Thereafter, as shown in FIG. 1(b), by an ordinary photolithographical technique, a resist pattern 15 having an opening with a diameter of 30 mm is formed on the rear side of the Cr film 14 so that the opening is located in the center of the film 14.

Figure 1C:
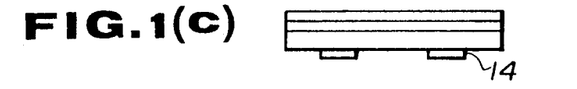

As shown in FIG. 1(c), next, the Cr film 14 was subjected to a liquid phase etching process with the resist pattern 15 used as a mask and with use of a solution of Cerium Diammonium Nitrate.

Thereafter, a magnetron DC sputter was used to deposit a 0.5 μm-thick W film 16 on the $Al_2O_3$ film 13, under conditions that a sputtering power was 1 kw, a gas pressure was set at 3 mTorr so that the stress of the high-density W film on its low pressure side becomes zero. As a result of measuring based on the warpage of the Si substrate 11, the stress of the formed W film 16 was $3 \times 10^8$ dyn/cm$^2$.

Figure 1D:
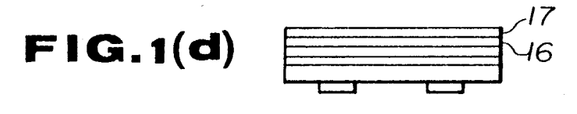

As shown in FIG. 1(d), ion implantation was carried out in the W film 16 at an energy of 180 keV with a dose of $3 \times 10^{15}$ atoms/cm$^2$ and with use of Ar ions to make zero the stress of the W film 16. And the W film 16 is subjected thereon to a sputtering process so that an aluminum oxide film 17 having a thickness of 50 nm as an etching mask is deposited on the W film 16.

Figure 1E:
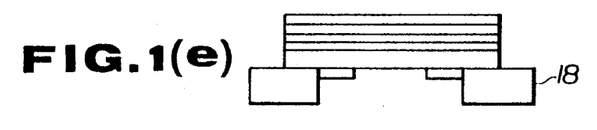

As shown in FIG. 1(e), a reinforcement silicon frame 18 coated with a $SiO_2$ film was bonded directly to the Si substrate 11 as a mask substrate without using any adhesive agent. The direct bonding refers to bonding the two parts utilizing an interatomic force occurred between the bonding surfaces which have been finished as fine as a mirror surface. The direct bonding was carried out by holding the reinforcement frame 18 on a stage using a 1 mm-thick elastic rubber (Viton) and then applying a force of 1.0 kg/cm$^2$ for one minute thereto. The direct bonding was carried out in a vacuum atmosphere for the purpose of preventing air from remaining on the bonding surfaces. Finally, the resultant assembly was subjected to a heat treatment for 3 minutes at 400° C. to increase its bonding strength.

Figure 1F:
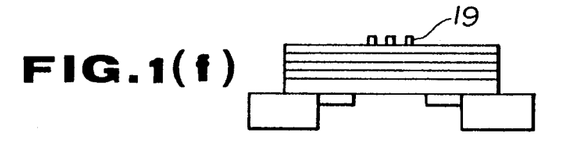

As shown in FIG. 1(f), a 0.5 μm-thick chemical amplified resist (SAL601) was coated on the aluminum oxide film 17 to form an electron beam resist 19, subjected to a baking process at 150° C. in an $N_2$ atmosphere to remove solvent in the electron beam resist 19, and then subjected to a writing operation of an electron beam writer to form a desired pattern (having a minimum linewidth of 0.15 μm). In this case, the dose was 13 μC/cm$^2$.

Figure 1G:
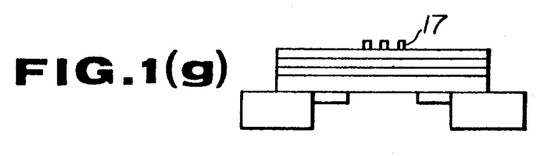

Further, as shown in FIG. 1(g), an ECR type plasma etching system was used to subject the aluminum oxide film 17 to an etching process with the resist 19 used as a mask and with use of an etching gas $BCl_3$.

Figure 1H:
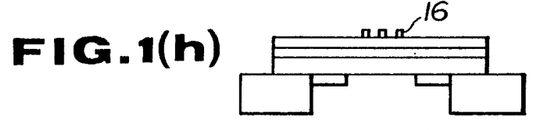
Figure 2:
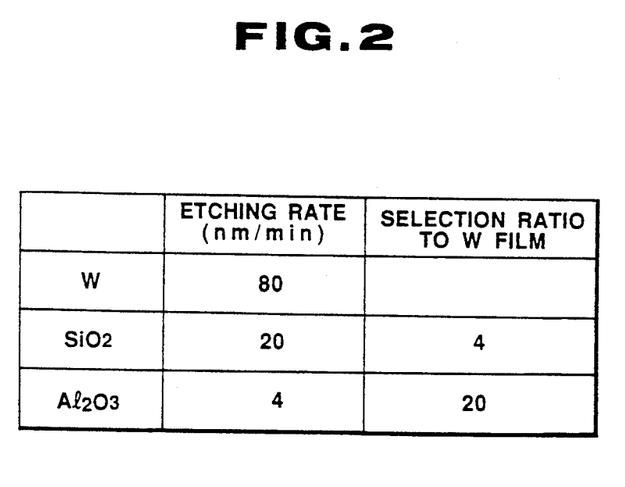
FIG. 2 shows measured results of etching rate and selection ratio with respect to different materials.

As shown in FIG. 1(b), the W film 16 was subjected to an anisotropic etching with the aluminum oxide film pattern 17 used as a mask. In this case, a mixture gas of $SF_6+CHF_3$ was used as an etching gas, a pressure was set at 30 mTorr, and an applied power was at 200 W. On the surface of the W film (like $SiO_2$), since reactive ion etching based on fluorine particles as etchant is advanced, the etching rate is fast. On the aluminum oxide, on the other hand, since etching based only on physical sputtering is advanced, the etching rate is slow. Measurement results of the etching rate and selection ratio under the above conditions are shown in FIG. 2. It will be seen from these results that the aluminum oxide can have a sufficient selection ratio (=20) for the etching of the W film.

Figure 1I:
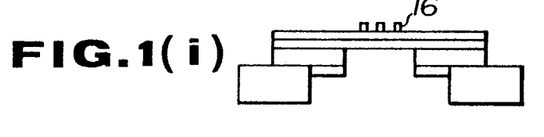

As shown in FIG. 1(i), the Si substrate 11 was subjected to a liquid phase etching to remove a part thereof with the Cr film 14 used as a mask and with use of a solution of potassium hydroxide heated to 95° C. and having a concentration of 30%, whereby an opening having a diameter of 30 mm is made in the Si substrate 11.

Figure 1J:
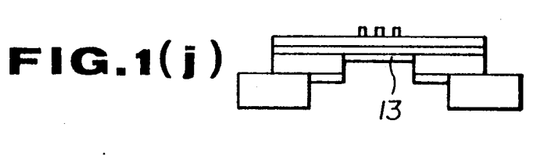

Finally, as shown in FIG. 1(j), an aluminum oxide film 13 as an anti-reflective film was deposited on the side of the X-ray permeable film opposed to the X-ray absorber pattern to be 98 nm thick by a reactive sputtering process.

When an X-ray mask fabricated through the above steps was subjected to a measurement of visible-light transmissivity, the measured transmissivity was 92% at a wavelength of 633 nm. It has been further confirmed that an alignment signal for an X-ray stepper was able to be detected with a high S/N ratio and no variations in the thickness of the aluminum oxide film as the anti-reflective film was able to be observed even under an alignment mark of a rough pattern.

In order to evaluate the X-ray mask, positional shifts in the pattern of the X-ray mask were measured. The measurement was conducted over a measurement range of 20×20 mm in the mask including a cruciform pattern. When a positional shift in the cruciform pattern of the mask with respect to its design value was measured and evaluated with use of an XY interferometric measuring system Nikon 3I, the positional shift was as remarkably small as below 0.03 μm (3σ). Further, when the shape of the X-ray absorber pattern was observed with use of an SEM, it was confirmed that a favorable fine pattern with a linewidth of 0.15 μm has been formed without edge roughness.

The present invention is not limited to the above embodiment. For example, the X-ray absorber is not restricted only to W but Ta, Mo, nitrides or carbides thereof, or Au may be employed. Further, the material of the X-ray permeable thin film is not restricted to SiC but may be diamond, $SiN_x$, BC, or silicon doped with boron. Furthermore, the material of the reinforcement frame is not limited to silicon but may be silicon compound or a glass such as Pyrex (Trademark) glass. In addition, the process of forming the aluminum oxide film is not limited only to the sputtering but an anodizing process or a plasma oxidizing process may be employed as necessary. Further, the aluminum oxide film as the anti-reflective film is not necessarily be exactly 98 nm in thickness, the thickness may be slightly increased or decreased.

The present invention may be modified and embodied in various ways without departing from the gist of the invention.

Embodiment 2

Explanation will next be made as to a second embodiment of the present invention.

The present embodiment is featured in that the aluminum oxide film of the embodiment 1 as the anti-reflective film is replaced by an $SiO_2$ film 23, the $SiO_2$ film 23 is formed sufficiently thick until its surface becomes smooth, and thereafter subjected to an etching-back process until it has a desired thickness. The other steps are substantially the same as those in the embodiment 1.

FIGS. 3(a) to 3(j) show cross-sectional views of steps in a method for fabricating an X-ray mask in accordance with the present embodiment of the invention.

As in the embodiment 1, first of all, a low pressure chemical vapor deposition (LPCVD) system of an RF induction heater type is used, a silicon substrate (mask substrate) 21 polished at its both surfaces and having a diameter of 3 inches, a thickness of 550 μm and a planar orientation (100) is placed on a susceptor coated on its graphite surface with SiC and then subjected to a surface etching process with use of an HCl gas. In this case, the temperature of the substrate was set to be 1100° C. Through the surface etching, such contaminants such as a spontaneous oxide film and a heavy metal group present on the surface of the silicon substrate 21 were removed. At this stage, the cleaning process of the surface of the silicon substrate is completed.

Figure 3A:
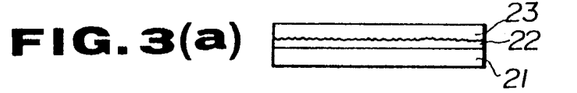
FIGS. 3(a) to 3(j) show steps in a method for fabricating an X-ray exposure mask in accordance with a second embodiment of the present invention.
Figure 4:
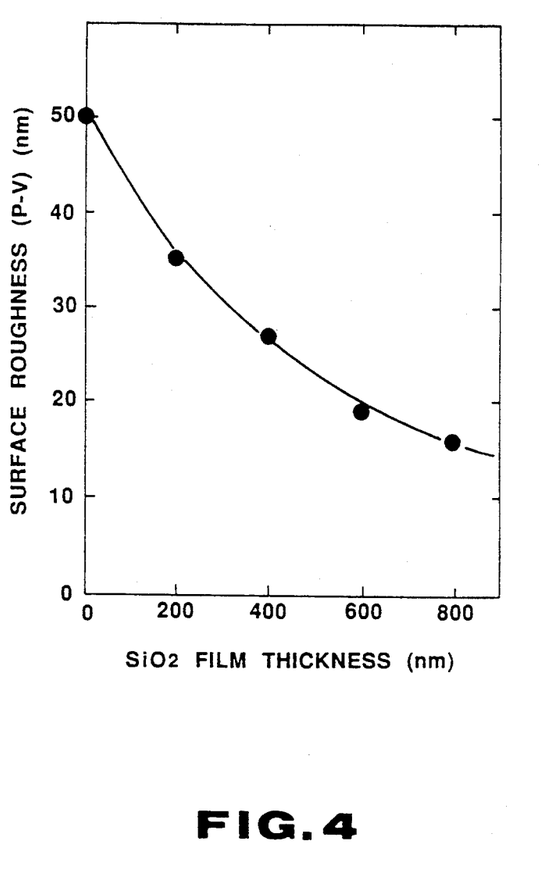
FIG. 4 shows a relationship between the deposited film thickness and surface roughness of a silicon oxide film in the method of the second embodiment of the present invention.

Then, as shown in FIG. 3(a), a 1 μm-thick SiC film 22 is deposited on the silicon substrate 21, and then subjected to an LPCVD process to form a 600 nm-thick silicon oxide ($SiO_2$) film 23 thereon as an anti-reflective film. Thereafter, in order to improve the resistance to the etching, about 10 nm-thick of an aluminum oxide may be deposited on the silicon oxide film 23 by a sputtering process. The deposition conditions were such that an $Si(OC_2H_5)_4$ was used as a material gas, a substrate temperature was set at 750° C. and a pressure was at 1.0 Torr. At this stage, the surface of the silicon oxide film, is flattened, even though the surface of the SiC film 22 has the raised and recessed surface. Measurement results of the relationship between the deposited film thickness and surface roughness are shown in FIG. 4. It will be appreciated from the drawing that, when the deposition thickness is set to be above 600 nm, a sufficient smoothness can be obtained.

Figure 3B:
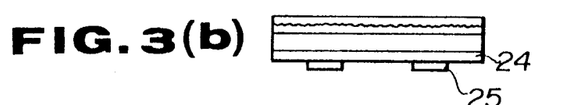
Figure 5:
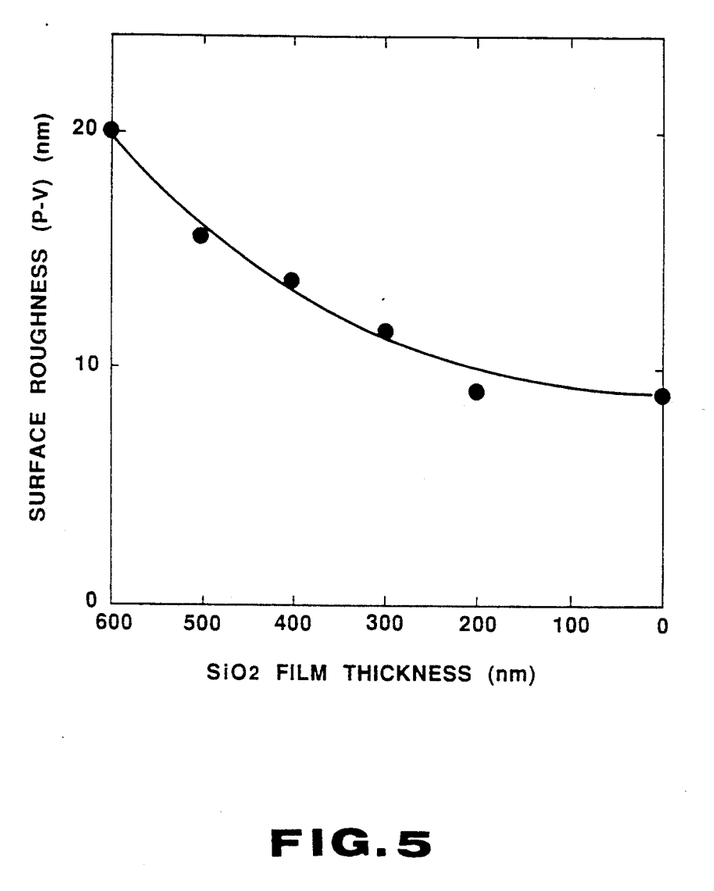
FIG. 5 shows a relationship between the film thickness and surface roughness of a silicon oxide film in an etching-back step of the method of the second embodiment of the present invention.

As shown in FIG. 3(b), next, the silicon oxide film was subjected to a chemical dry etching with use of a mixture gas of $CF_4+O_2$ as an etching gas to have a desired thickness of 100 nm. The etching was carried out under condition of a flow rate of $CF_4$ gas of 20 sccm, a flow rate of $O_2$ gas of 10 sccm, and a pressure of 100 mTorr. When the thus-obtained silicon oxide film was subjected to a measurement of its surface roughness with use of an STM, the measured surface roughness was 10 nm (p-v) that is sufficiently small, i.e., the surface was made sufficiently smooth. FIG. 5 shows measurement results of the then relationship between the film thickness and evenness after the etching-back. It will be seen from the results of FIG. 5 that the evenness is further improved by the etching-back. A 0.1 μm-thick Cr film 24 is deposited on the rear surface of the silicon substrate 21 with use of a vacuum evaporator using electron beam, and then subjected to an ordinary photolithographical process to form thereon a resist pattern 25 with an opening having a diameter of 30 mm located in the center of the Cr film 24.

Figure 3C:
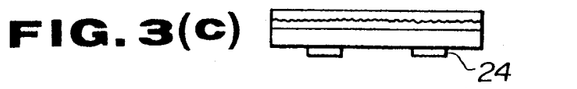

In the next step, as shown in FIG. 3(c), the Cr film 24 was subjected to a liquid phase etching with the resist pattern 25 used as a mask and with use of a solution of Cerium diammonium Nitrate.

Thereafter, a magnetron DC sputter was used to deposit a 0.5 μm-thick W film 26 on the SiC film 22, under conditions that a sputtering power was 1 kw, a gas pressure was set at 3 mTorr so that the stress of the high-density W film on its low pressure side becomes zero. As a result of measuring based on the warpage of the Si substrate 21, the stress of the formed W film 26 was $3 \times 10^8 dyn/cm^2$.

Figure 3D:
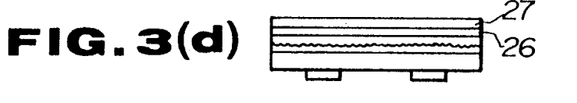

As shown in FIG. 3(d), Ar ion implantation was carried out in the W film 26 at an energy of 180 keV with a dose of $3 \times 10^{15} atoms/cm^2$ to make zero the stress of the W film 26. And the W film 26 was subjected thereon to a sputtering process so that an aluminum oxide film 27 having a thickness of 50 nm as an etching mask is deposited on the W film 26.

Figure 3E:
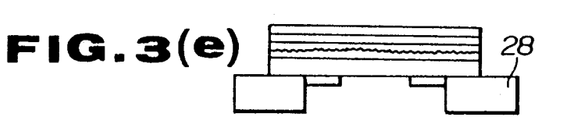

As shown in FIG. 3(e), a reinforcement silicon frame 28 coated with a $SiO_2$ film was bonded directly to the Si substrate 21 as a mask substrate without using any adhesive agent. The direct bonding refers to bonding the two parts utilizing an interatomic force occurred between the bonding surfaces which have been finished as fine as a mirror surface. The direct bonding was carried out by holding the reinforcement frame 28 on a stage using a 1 mm-thick elastic rubber (Viton) and then applying a force of 1.0 kg/cm² for one minute thereto. The direct bonding was carried out in a vacuum atmosphere for the purpose of preventing air from remaining on the bonding surfaces. Finally, the resultant assembly was subjected to a heat treatment for 3 minutes at 400° C. to increase its bonding strength.

Figure 3F:
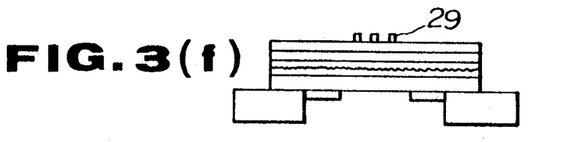

As shown in FIG. 3(f), a 0.5 μm-thick chemical amplified resist (SAL601) was coated on the aluminum oxide film 27 thick to form an electron beam resist 29, subjected to a baking process at 150 C in an $N_2$ atmosphere to remove solvent in the electron beam resist 29, and then subjected to a writing operation of an electron beam writer to form a desired pattern (having a minimum linewidth of 0.15 μm). In this case, the dose was 13 μC/cm$^2$.

Figure 3G:
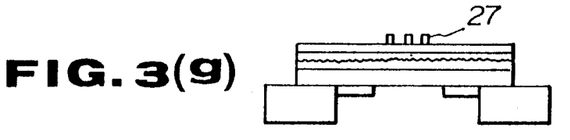

Further, as shown in FIG. 3(g), an ECR type plasma etching system was used to subject the aluminum oxide film 27 to an etching processing with the resist 29 used as a mask and with use of an etching gas $BCl_3$.

Figure 3H:
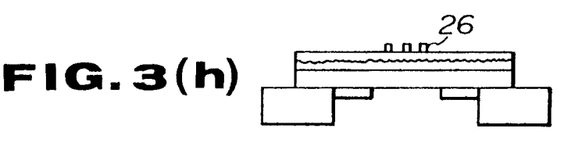

As shown in FIG. 3(h), the W film 26 was subjected to an anisotropic etching with the aluminum oxide film pattern 27 used as a mask. In this case, a mixture gas of $SF_6+CHF_3$ was used as an etching gas, a pressure was set at 30 mTorr, and an applied power was 200 W.

Figure 3I:
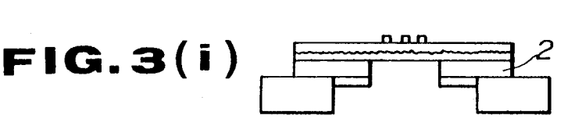

As shown in FIG. 3(i), the Si substrate 21 was subjected to a liquid phase etching to remove a part thereof with the Cr film 24 used as a mask and with use of a solution of potassium hydroxide heated to 95° C. and having a concentration of 30%, whereby an opening having a diameter of 30 mm was formed.

Figure 3J:
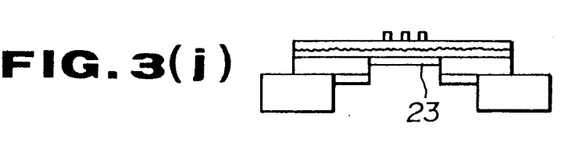

Further, as shown in FIG. 3(j), an aluminum oxide film 23 as an anti-reflective film was deposited on the side of the X-ray permeable film opposed to the X-ray absorber pattern to be 100 nm thick by a reactive sputtering process.

When an X-ray mask fabricated through the above steps was subjected to a measurement of visible-light transmissivity, the measured transmissivity was 92% at a wavelength of 633 nm. In order to evaluate the X-ray mask, positional shifts in the pattern of the X-ray mask were measured. The measurement was conducted over a measurement range of 20×20 mm in the mask including a cruciform pattern. When a positional shift in the cruciform pattern of the mask with respect to its design value was measured and evaluated with use of the XY interferometric measuring system Nikon 3I, the positional shift was as remarkable small as below 0.03 μm (3σ). Further, when the shape of the X-ray absorber pattern was observed with use of an SEM, it was confirmed that a favorable fine pattern with a linewidth of 0.15 μm has been formed without edge roughness. Although explanation has been made in connection with the case where the silicon oxide is used as the anti-reflective film in the foregoing embodiment, the anti-reflective film may be made of chromium oxide, aluminum oxide or silicon nitride as necessary.

Further, as the method for depositing the anti-reflective film, a sputtering and a chemical vapor deposition (CVD) process, in addition to the LPCVD process, may be used; and as the etching in the etching-back process, a reactive ion etching, an ECR etching or an ion milling may be used.

Embodiment 3

Explanation will then be made as to a third embodiment of the present invention.

The present embodiment is featured in that, when the $SiO_2$ film 23 of the embodiment 2 is formed as the anti-reflective film, the film is made smooth by a spin coating method. Other steps are substantially the same as those in the embodiment 2.

FIGS. 6(a) to 6(k) show cross-sectional views of steps in a method for fabricating an X-ray mask in accordance with the present embodiment of the invention.

As in the embodiment 2, first of all, a low pressure chemical vapor deposition (LPCVD) system of an RF induction heater type is used, a silicon substrate (mask substrate) 31 polished at its both surfaces and having a diameter of 3 inches, a thickness of 550 μm and a planar orientation (111) is placed on a susceptor coated on its graphite surface with SiC and then subjected to a surface etching process with use of an HCl gas. In this case, the temperature of the substrate was set to be 1100° C. Through the surface etching, such contaminants such as a spontaneous oxide film and a heavy metal group present on the surface of the silicon substrate 31 were removed. At this stage, the cleaning process of the surface of the silicon substrate is completed.

Figure 6A:
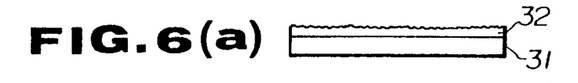
FIGS. 6(a) to 6(k) show steps in a method for fabricating an X-ray exposure mask in accordance with a third embodiment of the present invention.

Then, as shown in FIG. 6(a), a 1 m-thick SiC film 32 is deposited on the silicon substrate 31.

Figure 6B:
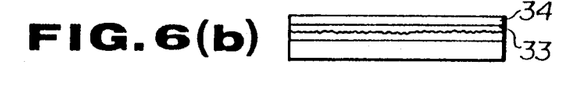
Figure 7:
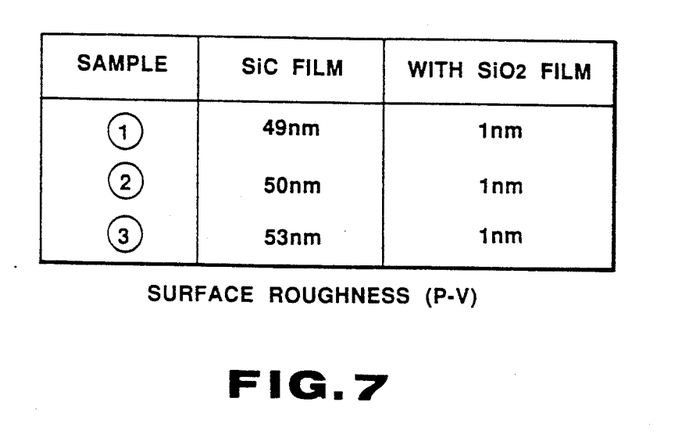
FIG. 7 shows a relationship between the surface roughness of an SiC film and the surface roughness of an $SiO_2$ in the third embodiment of the present invention.

Thereafter, as shown in FIG. 6(b), a silicon oxide ($SiO_2$) 33 is coated to have a film thickness of 109 nm as an anti-reflective film by the spin coating method. The coating formation was carried out by spinningly coating $SiO_2$ film coating solution (having an $SiO_2$ concentration of 5%) produced by Tokyo Ouyou Kagaku Kabushiki Kaisha at a spinning speed of 3000 rpm and then by subjecting it to a heating treatment for 30 minutes in a nitrogen atmosphere of 250° C. When the surface roughness of the $SiO_2$ film was measured, it was 1 nm (p-v) and thus the surface was flat. Measurement results of the relationship between the surface roughness of the SiC film and the surface roughness after the coating of the $SiO_2$ film are shown in FIG. 7. It will be seen from the results that the surface is made remarkably smooth. Further formed on the silicon oxide film 33 is an aluminum oxide film 34 by a sputtering process. The aluminum oxide film 34 plays a role of an etching stopper during the patterning of the W film.

Figure 6C:
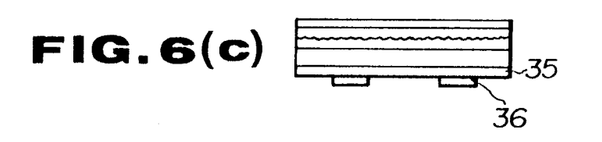

Further, as shown in FIG. 6(c), a 0.1 μm-thick Cr film 35 is deposited on the rear surface of the silicon substrate 31 with use of a vacuum evaporator using electron beam, and then subjected to an ordinary photolithographical process to form thereon a resist pattern 36 with an opening having a diameter of 30 mm located in the center of the Cr film 35.

Figure 6D:
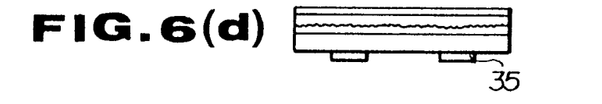

In the next step, as shown in FIG. 6(d), the Cr film 35 was subjected to a liquid phase etching with the resist pattern 36 used as a mask and with use of a solution of Cerium diammonium Nitrate.

Figure 6E:
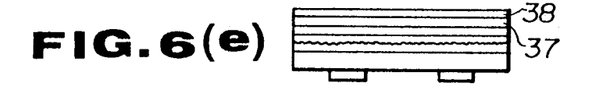

Thereafter, as shown in FIG. 6(e), a magnetron DC sputter was used to deposit a 0.5 μm-thick W film 37 on the aluminum oxide film 34, under conditions that a sputtering power was 1 kw, a gas pressure was set at 3 mTorr so that the stress of the high-density W film on its low pressure side becomes zero. As a result of measuring based on the warpage of the Si substrate 31, the stress of the formed W film 37 was $3 \times 10^8 dyn/cm^2$. Next, Ar ion implantation was carried out in the W film 37 at an energy of 180 keV with a dose of $3 \times 10^{15} atoms/cm^2$ to make zero the stress of the W film 37. And the W film 37 was subjected thereon to a sputtering process so that an aluminum oxide film 38 having a thickness of 50 nm as an etching mask is deposited on the W film 37.

Figure 6F:
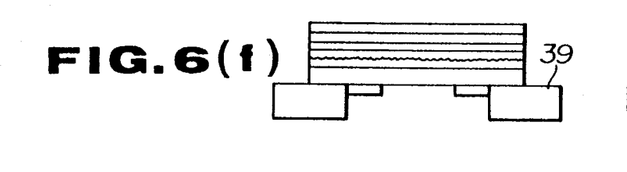

As shown in FIG. 6(f), further, a reinforcement silicon frame 39 coated with a $SiO_2$ film was bonded directly to the Si substrate 31 as a mask substrate without using any adhesive agent.

Figure 6G:
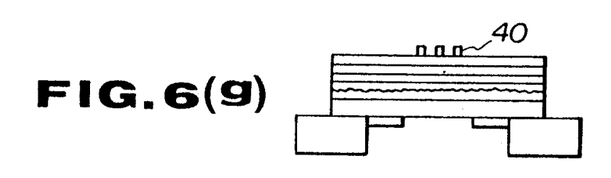

As shown in FIG. 6(g), a 0.5 μm-thick chemical amplified resist (SAL601) was coated on the aluminum oxide film 38 to form an electron beam resist 40, subjected to a baking process at 150° C. in an $N_2$ atmosphere to remove solvent in the electron beam resist 40, and then the resist 40 was subjected to a writing operation of an electron beam writer to form a desired pattern (having a minimum linewidth of 0.15 μm). In this case, the dose was 13 μC/cm$^2$.

Figure 6H:
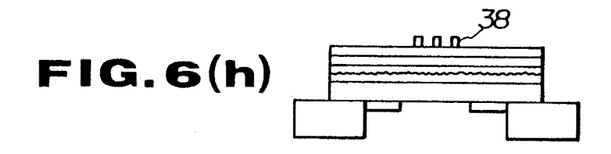

Further, as shown in FIG. 6(h), an ECR type plasma etching system was used to subject the aluminum oxide film 38 to an etching process with the resist 40 used as a mask and with use of an etching gas BCl$_3$.

Figure 6I:
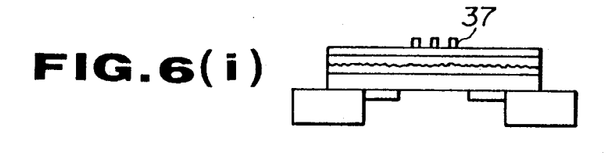

As shown in FIG. 6(i), the W film 37 was subjected to an anisotropic etching with the aluminum oxide film pattern 38 used as a mask. In this case, a mixture gas of SF$_6$+CHF$_3$ was used as an etching gas, a pressure was set at 20 mTorr, and an applied power was 200 W.

Figures 6J, 6K:
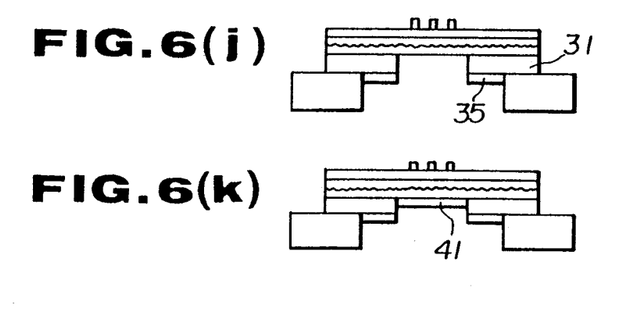

As shown in FIG. 6(j), the Si substrate 31 was subjected to a liquid phase etching to remove a part thereof with the Cr film 35 used as a mask and with use of a solution of potassium hydroxide heated to 95° C. and having a concentration of 30%, whereby an opening having a diameter of 30 mm was formed.

Further, as shown in FIG. 6(k), a silicon oxide film 41 as an anti-reflective film was deposited on the side of the X-ray permeable film opposed to the X-ray absorber pattern to be 109 nm thick by a reactive sputtering process.

When an X-ray mask fabricated through the above steps was subjected to a measurement of visible-light transmissivity, the measured transmissivity was 92% at a wavelength of 633 nm. In order to evaluate the X-ray mask, positional shifts in the pattern of the X-ray mask were measured. The measurement was conducted over a measurement range of 20×20 mm in the mask including a cruciform pattern. When a positional shift in the cruciform pattern of the mask with respect to its design value was measured and evaluated with use of the XY interferometric measuring system Nikon 3I, the positional shift was as remarkably small as below 0.03 μm (3σ). Further, when the shape of the X-ray absorber pattern was observed with use of an SEM, it was confirmed that a favorable fine pattern with a linewidth of 0.15 μm has been formed without edge roughness.

Embodiment 4

Next a fourth embodiment of the present invention will be explained.

The present embodiment is featured in that an SiC film as an X-ray permeable thin film is sandwiched between an anti-reflective film and an aluminum oxide film as an etching stopper. The other steps are substantially the same as those in the embodiment 2.

FIGS. 9(a) to 9(g) show cross-sectional views of steps in a method for fabricating an X-ray mask in accordance with the present embodiment of the invention.

Figure 9A:
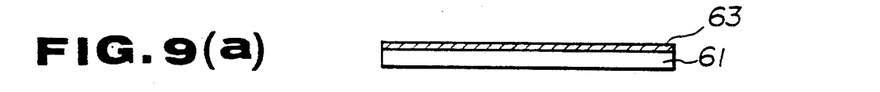
FIGS. 9(a) to 9(g) show steps in a method for fabricating an X-ray exposure mask in accordance with a fourth embodiment of the present invention.

As shown in FIG. 9(a), a 98 nm-thick aluminum oxide film 63 is deposited by the sputtering on a silicon substrate 61.

Figure 9B:
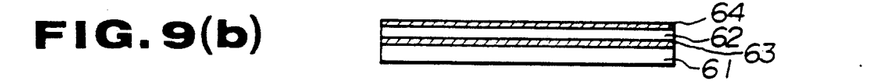

Thereafter, as shown in FIG. 9(b), a 1 μm-thick SiC film 62 is deposited by the LPCVD system and further an aluminum oxide film 64 as an anti-reflective/anti-etching film is coated by the sputtering to be 98 nm thick.

Figure 9C:
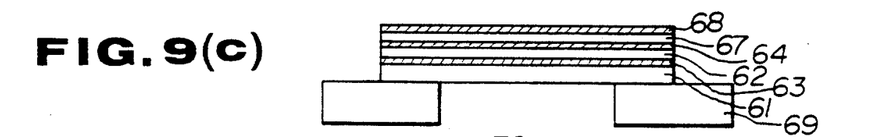

Further, as shown in FIG. 9(c), a magnetron DC sputter was used to deposit a 0.5 μm-thick W film 67 on the aluminum oxide film 64, under conditions that a sputtering power was 1 kw, a gas pressure was set at 3 mTorr so that the stress of the high-density W film on its low pressure side becomes zero. As a result of measuring based on the warpage of the Si substrate 61, the stress of the formed W film 67 was $3 \times 10^8$ dyn/cm$^2$. Next, Ar ion implantation was carried out in the W film 67 at an energy of 180 keV with a dose of $3 \times 10^{15}$ atoms/cm$^2$ to make zero the stress of the W film 67. And the W film 67 was subjected thereon to a sputtering process so that an aluminum oxide film 68 having a thickness of 50 nm as an etching mask is deposited on the W film 67. After this, a reinforcement silicon frame 69 coated with a SiO$_2$ film was bonded directly to the Si substrate 61 as a mask substrate without using any adhesive agent.

Figure 9D:
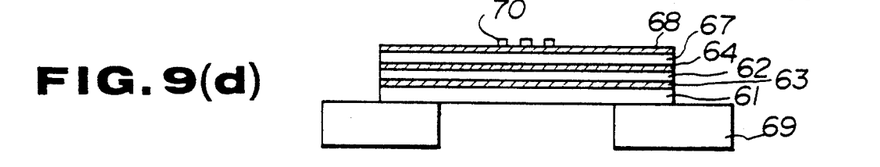

As shown in FIG. 9(d), a 0.5 μm-thick chemical amplified resist (SAL601) was coated on the aluminum oxide film 68 to form an electron beam resist 70, subjected to a baking process at 150° C. in an $N_2$ atmosphere to remove solvent in the electron beam resist 70, and then the resist 70 was subjected to a writing operation of an electron beam writer to form a desired pattern (having a minimum linewidth of 0.15 μm). In this case, the dose was 13 μC/cm$^2$.

Figure 9E:
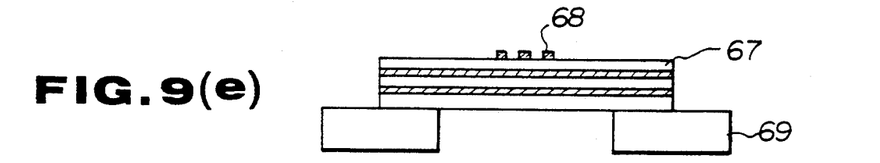

Further, as shown in FIG. 9(e), an ECR type plasma etcher was used to subject the aluminum oxide film 68 to an etching process with the resist 70 used as a mask and with use of an etching gas BCl$_3$.

Figure 9F:
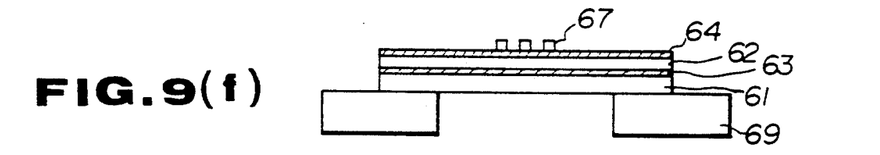

And as shown in FIG. 9(f), the W film 67 was subjected to an anisotropic etching with the aluminum oxide film pattern 68 used as a mask. In this case, a mixture gas of SF$_6$+CHF$_3$ was used as an etching gas, a pressure was set at 20 mTorr, and an applied power was 200 W.

Figure 9G:
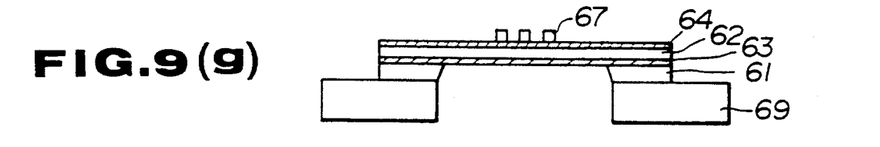

As shown in FIG. 9(g), the Si substrate 61 was subjected to a liquid phase etching to remove a part thereof with the reinforcing frame 69 used as a mask and with use of a solution of potassium hydroxide heated to 95 C. and having a concentration of 30%, whereby an opening having a diameter of 30 mm was formed.

With the X-ray mask thus fabricated, since the aluminum oxide film 63 is formed even on the rear side of the mask as the anti-reflective film and the aluminum oxide film 63 plays a role as a protective film at the time of making the opening in the mask substrate, a highly reliable X-ray mask can be obtained.

When an X-ray mask fabricated through the above steps was subjected to a measurement of visible-light transmissivity, the measured transmissivity was 92% at a wavelength of 633 nm. In order to evaluate the X-ray mask, positional shifts in the pattern of the X-ray mask were measured. The measurement was conducted over a measurement range of 20×20 mm in the mask including a cruciform pattern. When a positional shift in the cruciform pattern of the mask with respect to its design value was measured and evaluated with use of the XY interferometric measuring system Nikon 3I, the positional shift was as remarkably small as below 0.03 μm (3σ). Further, when the shape of the X-ray absorber pattern was observed with use of an SEM, it was confirmed that a favorable fine pattern with a linewidth of 0.15 μm has been formed without edge roughness.

Embodiment 5

A fifth embodiment of the present invention will next be made in connection with a case where an aluminum oxide film is used as an etching mask at the time of patterning a W film in a MOS FET fabricating method.

Figure 10A:
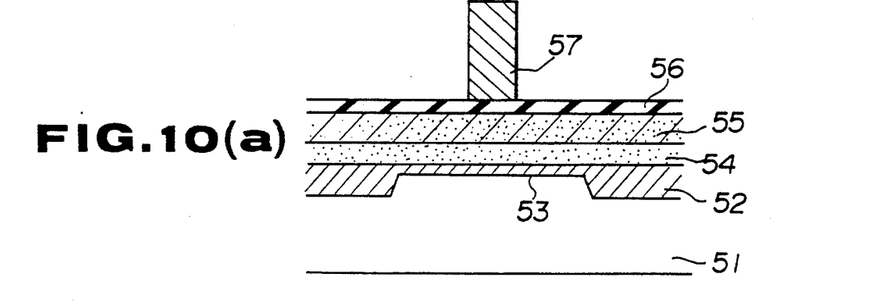
FIGS. 10(a) to 10(c) show steps in a method for fabricating a MOS FET in accordance with a fifth embodiment of the present invention.

As shown in FIG. 10(a), an inter-element separation region 52 is formed on a silicon substrate 51, then a gate insulating film 53 is formed, and then an n+ polysilicon film 54 and a W film 55 are sequentially formed by a CVD process. Further formed on the W film 55 by a sputtering are an aluminum oxide layer 56 and then a resist pattern 57 thereon.

Figure 10B:
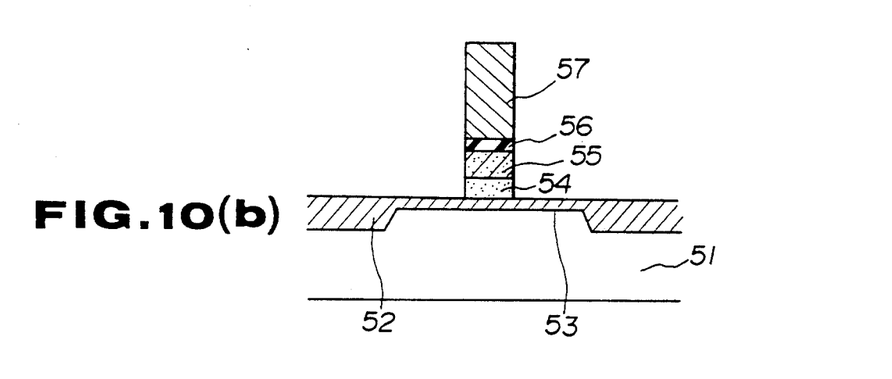

And the aluminum oxide layer 56 was subjected to a patterning process with the resist pattern 57 used as a mask with use of BCl$_3$, and then the W film 55 was subjected to an anisotropic etching process with the aluminum oxide film pattern 56 used as a mask. In this case, a mixture gas of SF$_6$+CHF$_3$ was used as an etching gas, a pressure was set at 30 mTorr and an applied power was at 200 W. On the surface of the W film, since reactive ion etching based on fluorine particles as etchant is active or advanced, the etching rate is fast; whereas, on the aluminum oxide layer, since the etching based only on the physical sputtering is advanced, the etching rate is slow. Accordingly, a sufficient selection ratio can be obtained and thus a W film pattern having high dimensional accuracy can be formed. In addition, the polysilicon film is etched to form a poly-side-gate (refer to FIG. 10(b)).

Figure 10C:
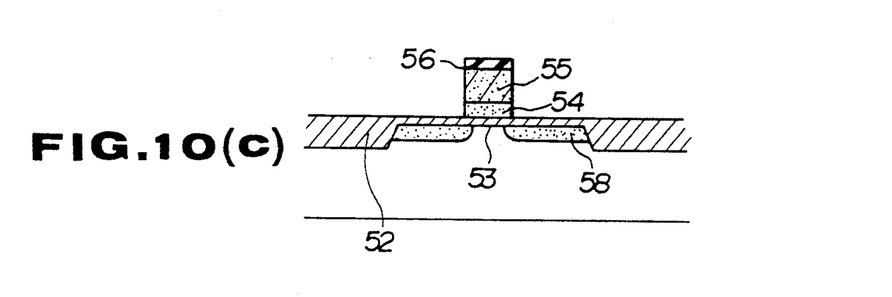

Then, ion implantation is carried out with the gate electrode used as a mask to form a source/drain region 58 and then the resist pattern 57 is removed, thus completing a MOS FET. In this connection, the aluminum oxide layer 56 may remain as an on-gate insulating film.

In this way, since the aluminum oxide film pattern is used as a mask during the etching of the W film, highly accurate patterning can be realized and thus element miniaturization can be facilitated.

As has been explained in the foregoing, in accordance with the present invention, since an X-ray mask having a flat and uniform anti-reflective film can be formed, there can be realized an X-ray exposure mask having an X-ray permeable film with a high visible-light transmissivity.

Further, pattern formation can be carried out with a high etching selection ratio.

What is claimed is:

1. An X-ray mask comprising:
   an X-ray permeable film having first and second surfaces;
   an aluminum oxide anti-reflective film on the first surface of the X-ray permeable film; and
   an X-ray absorber film pattern on the aluminum oxide anti-reflective film,
   wherein the aluminum oxide film has a reflective index n and a thickness of an odd integer multiple of $\lambda/4n$, wherein $\lambda$ is a wavelength in the range of visible light.

2. An X-ray mask as set forth in claim 1, wherein said X-ray permeable film includes an SiC film.

3. An X-ray mask as set forth in claim 1, wherein said X-ray permeable film includes a diamond film.

4. An X-ray mask as set forth in claim 1, further comprising a second aluminum oxide anti-reflective film on the second surface of the X-ray permeable film.

5. An X-ray mask comprising:
   an X-ray permeable film;
   an X-ray absorber film pattern on the X-ray permeable film; and
   an aluminum oxide anti-reflective film on the X-ray permeable film, the aluminum oxide anti-reflective film having a thickness of 98 nm, and being adapted for optical alignment with a wavelength of 633 nm.

6. A method for fabricating an X-ray mask, the method comprising:
   forming an X-ray permeable film;
   coating said X-ray permeable film with an aluminum oxide anti-reflective film having a refractive index n and a thickness of an odd integer multiple of $\lambda/4n$, wherein $\lambda$ is a wavelength in the range of visible light;
   forming an X-ray absorber film on said aluminum oxide film; and
   etching said X-ray absorber film to pattern the X-ray absorber film into a desired shape using said aluminum oxide film as an etching stopper.

7. The method as set forth in claim 6, further comprising a step of forming an anti-reflective film after said X-ray permeable film formation step and before said aluminum oxide film forming step.

8. A method for fabricating an X-ray mask comprising:
   forming an X-ray permeable film having a raised and recessed surface;
   forming an anti-reflective film on said X-ray permeable film to be sufficiently thick to completely cover the raised and recessed surface of the X-ray permeable film;
   etching back said anti-reflective film down to a desired thickness; and
   forming an X-ray absorber film pattern.

9. A method for fabricating an X-ray mask comprising:
   an X-ray permeable film formation step of forming an X-ray permeable film;
   forming an anti-reflective film on said X-ray permeable film by a spin coating method; and
   forming an X-ray absorber film pattern on said anti-reflective film.

10. A method for fabricating an X-ray mask comprising:
    forming an X-ray permeable film;
    forming an X-ray absorber film on said X-ray permeable film;
    forming an aluminum oxide layer pattern after deposition of an anti-reflective aluminum oxide layer on said X-ray absorber film by a sputtering process; and
    etching said X-ray absorber film using said aluminum oxide layer pattern as a mask.

11. A pattern formation method comprising:
    forming an aluminum oxide layer pattern on an etching layer; and
    etching said etching layer using said aluminum oxide layer pattern as an etching mask.

12. The method as set forth in claim 11, wherein said aluminum oxide layer pattern formation step includes a sputtering step of depositing an aluminum oxide layer by a sputtering process and a patterning step of patterning said aluminum oxide layer into a desired shape.

* * * * *